United States Patent
Zagoory et al.

(10) Patent No.: US 7,031,167 B1
(45) Date of Patent: Apr. 18, 2006

(54) WEDGELOCK FOR ELECTRONIC CIRCUIT CARD MODULE

(75) Inventors: Ronen Zagoory, Ashdod (IL); Eliyahu Shabtai, Modi'in (IL)

(73) Assignee: Elta Systems Ltd., Ashdod (IL)

( * ) Notice: Subject to any disclaimer, the term of this patent is extended or adjusted under 35 U.S.C. 154(b) by 0 days.

(21) Appl. No.: 10/995,535

(22) Filed: Nov. 24, 2004

(51) Int. Cl.
*H05K 7/12* (2006.01)

(52) U.S. Cl. .................. 361/759; 361/726; 361/732; 361/740; 361/747; 361/801

(58) Field of Classification Search ............... 361/741, 361/756, 720, 802, 726, 732, 740, 747, 759, 361/801
See application file for complete search history.

(56) References Cited

U.S. PATENT DOCUMENTS

| | | | | |
|---|---|---|---|---|
| 4,824,303 A | * | 4/1989 | Dinger | 411/79 |
| 5,211,496 A | * | 5/1993 | Hurowitz | 403/24 |
| 5,262,587 A | * | 11/1993 | Moser | 174/15.1 |
| 5,414,592 A | * | 5/1995 | Stout et al. | 361/704 |
| 5,461,541 A | | 10/1995 | Wentland, Jr. et al. | |
| 5,472,353 A | * | 12/1995 | Hristake et al. | 439/327 |
| 5,485,353 A | * | 1/1996 | Hayes et al. | 361/802 |
| 5,607,273 A | * | 3/1997 | Kecmer et al. | 411/79 |
| 5,779,388 A | * | 7/1998 | Yamamoto | 403/374.1 |
| 5,859,764 A | * | 1/1999 | Davis et al. | 361/704 |
| 6,212,075 B1 | * | 4/2001 | Habing et al. | 361/719 |
| 6,246,582 B1 | * | 6/2001 | Habing et al. | 361/704 |
| 6,249,936 B1 | * | 6/2001 | Webster | 24/569 |
| 6,285,564 B1 | * | 9/2001 | O'Brien | 361/801 |
| 6,615,997 B1 | * | 9/2003 | Danello et al. | 211/26 |
| 6,687,130 B1 | * | 2/2004 | Adams et al. | 361/740 |
| 6,765,798 B1 | * | 7/2004 | Ratliff et al. | 361/704 |
| 2003/0048049 A1 | * | 3/2003 | Seal | 312/294 |
| 2003/0048618 A1 | * | 3/2003 | Adams et al. | 361/740 |
| 2003/0146176 A1 | * | 8/2003 | Danello et al. | 211/26 |

* cited by examiner

*Primary Examiner*—Kamand Cuneo
*Assistant Examiner*—Dameon E. Levi
(74) *Attorney, Agent, or Firm*—Nath & Associates PLLC; Gregory B. Kang; Teresa M. Arroyo

(57) ABSTRACT

An arrangement for introducing a plate element, for which heat needs to be dissipated by means of conduction, into a slot of a chassis which is adapted to absorb the heat. The slot has a back wall adapted to contact the plate element upon its insertion, an opposing front wall, and a base wall. The plate element has margins adapted for carrying the arrangement. The arrangement comprises has a seat located on the margins. The arrangement further has a wedgelock moveably attached to the seat, having two slot engaging surfaces adapted to contact the front and base walls of the slot, and a seat engaging portion adapted to contact the seat. The arrangement further has an actuating mechanism adapted to cause a movement of the wedgelock in a direction toward the front wall and in a direction toward the base wall of the slot until a tight contact is established between the slot engaging surfaces of the wedgelock and the slot's front and base walls, while maintaining a tight contact between the seat engaging portion of the wedgelock and the seat and between the module and the back wall of the slot.

9 Claims, 2 Drawing Sheets

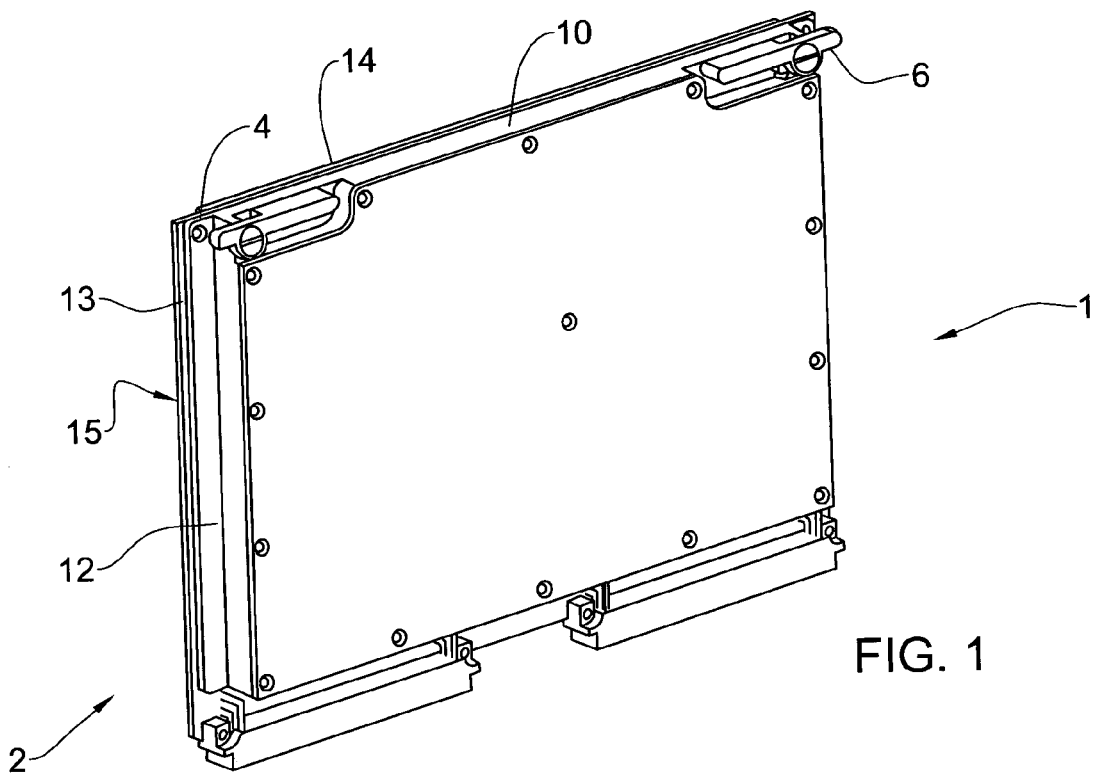
FIG. 1
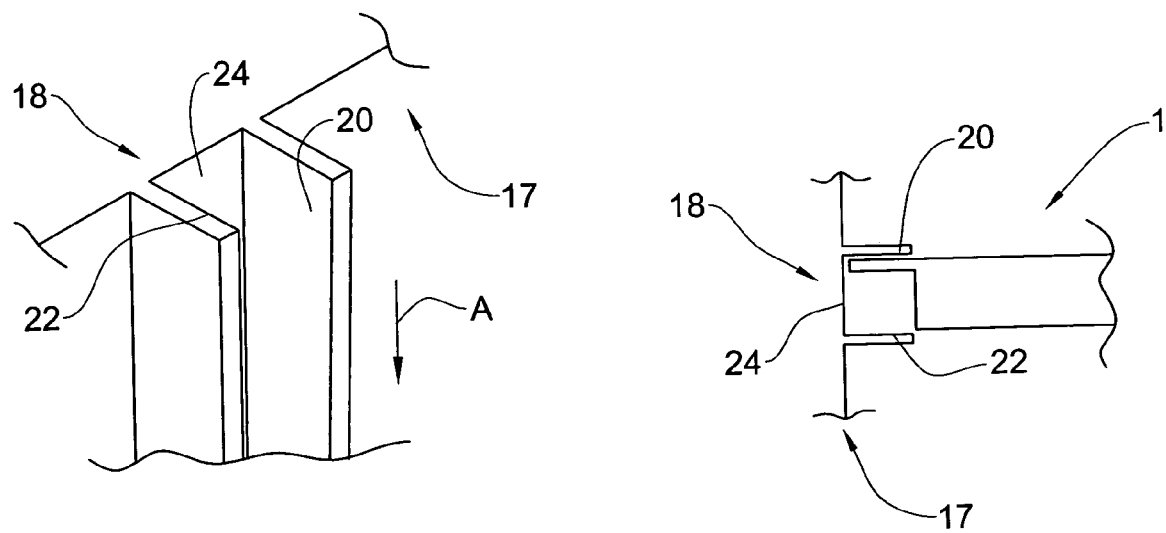
FIG. 2
FIG. 3

WEDGELOCK FOR ELECTRONIC CIRCUIT CARD MODULE

FIELD OF THE INVENTION

The present invention relates generally to arrangements for introducing a plate element for which heat needs to be dissipated by means of conduction into a chassis of an electronic device which is adapted to absorb this heat, and particularly to an electronic circuit card module, in particular of conduction cooled type, into a computer chassis, and to a wedgelock for use in such arrangements.

BACKGROUND OF THE INVENTION

In conventional electronic devices such as, for example, computer systems, electronic components are mounted on circuit cards, which are assembled into electronic circuit card modules. The circuit card modules are usually inserted into a chassis of an electronic device and, typically, plugged via a connector into an enclosure having a backplane or a motherboard. The circuit card modules may also include additional circuit cards, which are called mezaanine cards. The mezzanine card is electrically connected to the main card via a connector.

There are several standards defining properties of circuit card modules, for instance, VMEbus, SEM-E, PCI, cPCI standards, etc. The standards encompass mechanical specifications such as card dimensions, connector specifications, etc, along with electronic specifications such as bus structures, signal functions, timing, signal voltage levels, and master/slave configurations. These specifications enable different modules of the same standard supplied from different manufacturers to plug into any enclosure of the same standard, and provide for communications between different modules.

Proper cooling of electronic components in general, and those mounted on circuit cards in particular, is essential in electronic devices, wherein excessive beat generated by the electronic components can cause malfunctions and failure thereof. Depending on the manner of cooling, conventional circuit cards and, consequently, circuit card modules, are generally classified under convection cooled and conduction cooled types. In general, in the framework of the same standard, conventional convection and conduction cooled card modules are different in construction, however, both meeting the same standard electronic specifications.

Convection cooled card modules are mounted within the chassis of an electronic device in such a way as to allow the free flow of cooling air over electronic components to dissipate excess heat generated. The flow of air is usually provided by fan.

Convection cooled card modules are typically used when there are no severe requirements for protection of their cards from harsh environment such sand, dust, humidity etc. They also cannot be used in closed electronic devices where air ventilation is impossible.

Under the above conditions, conduction cooled card modules are conventionally utilized. In such modules, heat generated by electronic components of a circuit card is absorbed by an internal heat transmitting layer thereof, often made of copper, and thereby forwarded to a dissipation device, being commonly called a heat sink, usually constituted by the chassis in which the module are mounted. Since a conduction cooled circuit card does not require an air exchange over its electronic components, it can be hermetically sealed within its module or rather used in a sealed electronic device, as it happens most often.

Typically, the chassis is formed with a slot defined between front, back, and base walls thereof and the circuit card module is mounted in this slot so that its back surface is in contact with the back wall of the slot to transfer thereto the heat. In conventional circuit card modules, a wedgelock is typically used to keep the module in place, the wedgelock being mounted to the module with its one surface and abutting the front surface of the slot of the chassis with its other surface. Typically, each surface of the wedgelock is in partial contact with the circuit card module or the chassis.

U.S. Pat. No. 6,246,582 and U.S. Pat. No. 6,212,075 disclose a system for improving heat dissipation from a circuit card module by using a wedgelock with an increased surface adapted for contacting the walls of the slot.

SUMMARY OF THE INVENTION

According to the present invention, there is provided an arrangement for introducing a plate element into a slot of a chassis of an electronic device. The slot comprises a back wall which is adapted to contact the circuit card module upon its insertion. It further comprises a front wall opposite the back wall, and a base wall between the front and back walls. The plate element comprises margins adapted for carrying the arrangement. The arrangement comprises a seat located on the margins, a wedgelock extending longitudinally along the length of the margins and moveably attached to the seat, and an actuating mechanism.

According to one embodiment of the present invention, the plate element is a circuit card module.

The wedgelock comprises two slot engaging surfaces adapted to entirely contact the front and base walls of the slot. It further comprises a seat engaging portion adapted to contact the seat.

The actuating mechanism is adapted to cause a movement of the wedgelock in directions toward the front wall and toward the base wall of the slot. The movement is performed until at least a partial contact is established between the slot engaging surfaces of the wedgelock and the slot's front and base walls, while maintaining a contact between the seat engaging portion of the wedgelock and the seat. At the same time, a tight contact is established between the circuit card module and the back wall of the slot.

The actuating mechanism may comprise a rod and a bore at least partially receiving the rod both passing longitudinally along the wedgelock, and having correspondingly threaded portions. The rod is fixed, preventing its lateral and longitudinal movement, but allowing for rotation. Engaging the threaded portions of the rod and the bore, when the rod is rotated, results in a movement of the wedgelock along the rod. The geometry of the seat engaging portion of the seat and of the seat engaging portion of the wedgelock causes the wedgelock and circuit card module to cause the tight contact.

BRIEF DESCRIPTION OF THE DRAWINGS

In order to understand the invention and to see how it may be carried out in practice, one embodiment will now be described, by way of non-limiting example only, with reference to the accompanying drawings, in which:

FIG. 1 is a perspective view of a conduction-cooled circuit card module which may be mounted in a chassis of an electronic device by means of an arrangement of the present invention;

FIG. 2 is a partial perspective view of a section of a chassis of an electronic device which is adapted to receive a circuit card module;

FIG. 3 is a partial plan view of the conduction-cooled circuit card module inserted into a computer chassis;

DETAILED DESCRIPTION OF THE DRAWINGS

Figure 4:
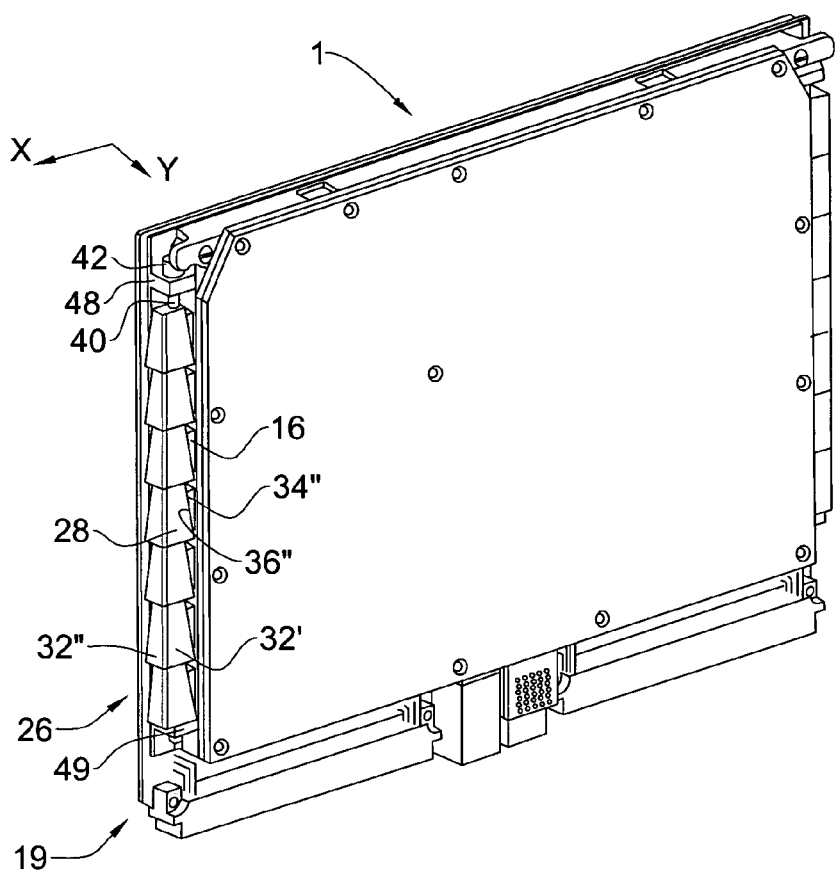
FIG. 4 is a perspective view of the circuit card module shown in FIG. 1 and attached thereto with an arrangement for mounting the module in a chassis of an electronic device according to the one embodiment of the present invention.

FIG. 1 shows a circuit card module 1 which may be mounted in a chassis by means of an arrangement according to the present invention. The circuit card module 1 is of the kind described in U.S. Pat. No. 6,392,891. The module comprises a circuit card 4 with a front frame 10 having margins 12 attached to front margin areas 13 of a circuit card, and with a rear plate 14 attached to the rear surface of the circuit card 4 so as to leave its back margin areas 15 exposed. The margins 12 of the front plate 10 and the back margin areas 15 of the circuit card 4 constitute margins 2 of the module 1. Operative surfaces of the circuit card 4, bearing electronic components (not seen), are covered by the frame 10. The circuit card module further comprises a pair of extractors 6 mounted at an upper edge area of the frame 10, which are deigned for facilitating the insertion/extraction of the circuit card module 1 in/from the chassis.

FIG. 2 shows a slot 18 in a chassis 17 which comprises a back wall 20 adapted to contact the exposed back margin areas 15 of the circuit card 4, a front wall 22, and a base wall 24. The circuit card module 1 is adapted for insertion, in a downward direction A, into the slot 18 so that its margins 2 are received within the slot 18.

Figure 5:
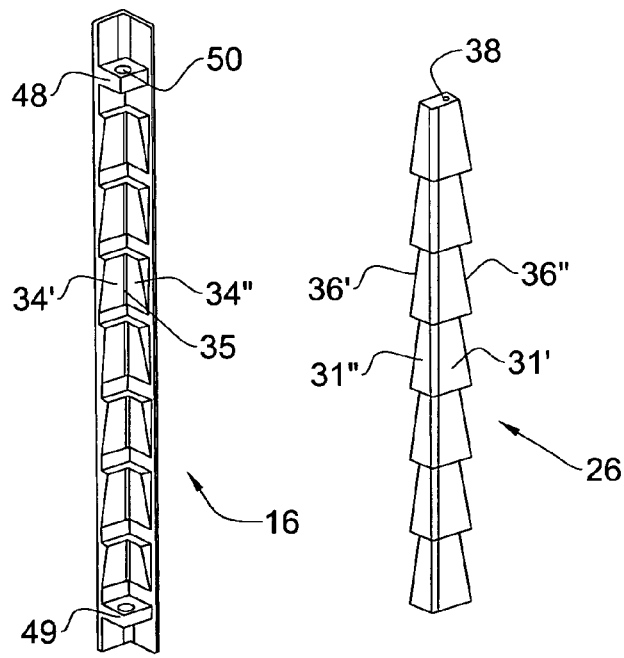
FIG. 5 is a perspective view of a seat constituting a part of the arrangement shown in FIG. 4.
Figure 6:
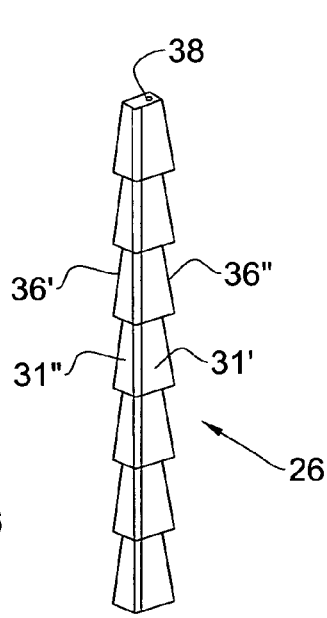
FIG. 6 is a perspective view of a wedgelock constituting a part of the arrangement shown in FIG. 4.

With reference to FIG. 4, the frame 10 comprises an arrangement 19 for introducing the module 1 into the slot 18. The arrangement 19 comprises a seat 16 (better seen in FIG. 5) which is either mounted to, the margins 12 of the frame 10 or is formed integrally therewith, and a wedgelock 26 (shown separately FIG. 6) which sits on the seat 16.

The seat 16 comprises a pair of juxtaposed longitudinally extending seat surfaces, each comprising a plurality of wedge-like protrusions 34' and 34" each pair of which defines between them an angle whose apex 35 extends longitudinally along the margins 12. Each protrusion 34', 34" is inclined toward the wedgelock 26 in a direction along the apex 35. The seat 16 further comprises a proximal end wall 48 and a distal end wall 49 extending therefrom. The end walls 48 and 49 each comprises a hole 50. The two holes 50 are coaxial. The wedgelock 26 sits between the two end walls 48 and 49.

The wedgelock 26 similarly comprises a pair of juxtaposed longitudinally extending wedgelock surfaces 36' and 36", corresponding to the protrusions 34' and 34" of the seat surfaces. The wedgelock surfaces 36' and 36" define between them an angle whose apex 37 (best seen in FIG. 7) extends longitudinally along the margins 12. The wedgelock surfaces 36' and 36" are inclined toward the seat 16 in a direction along the apex 37 and are adapted to mate with the protrusions 34' and 34" of the seat surfaces. The wedgelock 26 further comprises slot engaging surfaces 32' and 32" adapted to contact the front wall 22 and base wall 24 of the slot 18.

Figure 7:
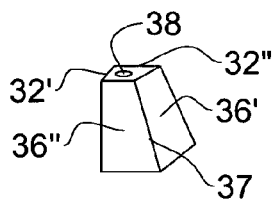
FIG. 7 is a perspective view of an element of the wedge-lock according to an optional embodiment of the present invention.
Figure 8:
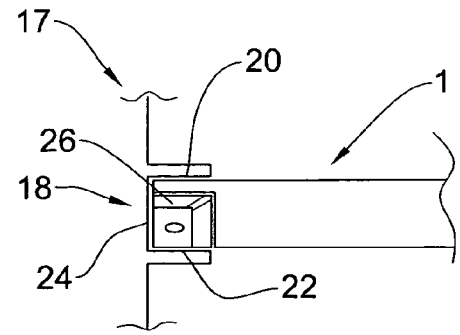
FIG. 8 is a partial plan view of the conduction-cooled circuit card module shown in FIG. 4 inserted into a chassis of an electronic device, shown in FIG. 2.

With reference to FIG. 7, according to an optional embodiment of the present invention, the wedgelock 26 comprises a series of elements 28 arranged longitudinally. Each of these elements 28 comprises portions of the two surfaces 36' and 36" adapted to engage respective wedge-like protrusions 34' and 34" of the seat, and portions of the two slot engaging surfaces 32' and 32" adapted to engage the front and base walls 22 and 24 of the slot 18. Each element 28 further comprises a section of a bore 38 passing longitudinally therethrough. At least the bottom portion of the bore 38 passing through the bottommost element 28 is threaded.

With reference to FIG. 4, the arrangement 19 further comprises an actuating mechanism adapted to cause a movement of the wedgelock 26 in two directions X and Y away from the seat 16. The actuating mechanism comprises the bore 38 (best seen in FIG. 6) passing longitudinally through the wedgelock 26 coaxial to the holes 50 and comprising, at a distal end, a threaded portion. The actuating mechanism further comprises a rod 40 adapted to be received by the bore 38 and the holes 50 of the end walls 48 and 49, and comprising a correspondingly threaded portion at a distal end. The rod further comprises a stopping mechanism 42 at its proximal end, which may be a flanged portion of a larger diameter than the hole 50. The rod 40 is adapted to exert an upward force on the wedgelock 26, so that the protrusions 34', 34" and the wedgelock surfaces 36', 36" actuate it in the directions X and Y, as described below.

The threaded portion of the rod 40 engages the threaded portion of the bore 38 in such a way that the rod 40 would tend to move distally. However, the stopping mechanism 42 prevents this movement, thereby applying a proximally directed force to the wedgelock. The geometry of the protrusions 34', 34" and the wedgelock surfaces 36', 36" prevents some upward movement by the wedgelock, while causing, a movement by the wedgelock in the X and Y directions. Upon contact of the slot-engaging portion of the wedgelock 26 with the slot 18, a path for thermal transfer is formed between the circuit card module 1 and the chassis 17. Further rotation of the rod 40 increases the contact pressure between the slot-engaging surfaces 32' and 32" of the wedgelock 26 and the front and base walls 22 and 24 of the slot 18, and between the back margin areas 15 and the back wall 20 of the slot 18. The increased contact pressure lowers the thermal resistance at the area of contact.

Those skilled in the art to which this invention pertains will readily appreciate that numerous changes, variations and modifications can be made without departing from the scope of the invention, mutatis mutandis.

The invention claimed is:

1. An arrangement for introducing a plate element for which heat needs to be dissipated by means of conduction into a slot of a chassis which is adapted to absorb the heat, the slot comprising a back wall adapted to contact the plate element upon its insertion, an opposing front wall, and a base wall extending perpendicularly therebetween; said plate element comprising margins adapted for carrying said arrangement; the arrangement comprising:
 (a) a seat located on the margins;
 (b) a wedgelock moveably attached to the seat, comprising two slot engaging surfaces adapted to contact the front and base walls of the slot, and a seat engaging portion adapted to contact the seat; and (c) an actuating mechanism adapted to cause a movement of the wedgelock in a direction toward the front wall and in a direction toward the base wall of the slot until a tight contact is established between the slot engaging surfaces of the wedgelock and the slot's front and base walls, while maintaining a tight contact between the seat engaging portion of the wedgelock and the seat and between the module and the back wall of the slot.

2. An arrangement according to claim 1, wherein the plate element is a circuit card module.

3. An arrangement according to claim 1, wherein the wedgelock extends longitudinally along at least a portion of the margin's length, the actuating mechanism being adapted to exert a longitudinal force on the wedgelock, said seat and seat engaging portion of the wedgelock having a geometry such that, upon the exertion of said force, the movement occurs simultaneously in the two directions.

4. The arrangement according to claim 3, wherein said seat has a pair of juxtaposed longitudinally extending seat surfaces, and said seat engaging surface of the wedgelock comprises a corresponding pair of juxtaposed longitudinally extending wedgelock surfaces, the longitudinally extending surfaces of each pair defining between them an angle with a longitudinally extending apex.

5. An arrangement according to claim 4, wherein the juxtaposed seat surfaces are each formed with at least one wedge-like protrusion inclined towards the wedgelock in the direction along said apex, said juxtaposed wedgelock surfaces being each inclined in the direction opposite to that of the seat surfaces to mate the seat surfaces.

6. An arrangement according to claim 5, wherein said wedgelock comprises a plurality of longitudinally arranged elements, at least one element comprising a slot base wall engaging portion and a slot front wall engaging portion constituting at least portions of said slot engaging surfaces of the wedgelock.

7. An arrangement according to claim 6, wherein said at least one element comprises portions of said juxtaposed wedgelock surfaces.

8. The arrangement according to claim 3, said actuating mechanism comprising a wedgelock bore passing longitudinally through said wedgelock and having a bore proximal end and a bore distal end being threaded; and a rod passing through said bore and comprising a rod proximal end portion protruding from said bore proximal end and a rod distal end portion threaded to cooperate with the threaded distal end of said bore, said rod being rotatable to actuate the wedgelock longitudinally, resulting in said movement.

9. The arrangement according to claim 8, wherein said actuating mechanism further comprises proximal and distal end walls formed in said seat and having respective proximal and distal seat bores aligned with said wedgelock bore and adapted to freely receive the respective rod proximal and distal end portions so as to allow the rotation of the rod but restrict the longitudinal movement of the rod in the bore.

* * * * *

UNITED STATES PATENT AND TRADEMARK OFFICE
CERTIFICATE OF CORRECTION

| | |
|---|---|
| PATENT NO. | : 7,031,167 B1 |
| APPLICATION NO. | : 10/995535 |
| DATED | : April 18, 2006 |
| INVENTOR(S) | : Zagoory et al. |

Page 1 of 1

It is certified that error appears in the above-identified patent and that said Letters Patent is hereby corrected as shown below:

Claim 1, Column 5, Line 10,
Please delete
"module" and replace with -- plate element --

Signed and Sealed this

Twentieth Day of February, 2007

JON W. DUDAS
*Director of the United States Patent and Trademark Office*